(12) United States Patent
Belke et al.

(10) Patent No.: US 6,490,786 B2
(45) Date of Patent: Dec. 10, 2002

(54) CIRCUIT ASSEMBLY AND A METHOD FOR MAKING THE SAME

(75) Inventors: Robert Edward Belke, West Bloomfield, MI (US); Charles Alan Still, Clinton, MI (US); Robert Joseph Gordon, Livonia, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/836,658

(22) Filed: Apr. 17, 2001

(65) Prior Publication Data

US 2002/0148636 A1 Oct. 17, 2002

(51) Int. Cl.[7] ................................................ H05K 3/36
(52) U.S. Cl. ............................. 29/830; 29/825; 29/831
(58) Field of Search .......................... 29/830, 831, 840, 29/846, 825

(56) References Cited

U.S. PATENT DOCUMENTS

| | | | | |
|---|---|---|---|---|
| 4,554,033 A | * | 11/1985 | Dery et al. | |
| 4,654,961 A | * | 4/1987 | Uehara et al. | |
| 5,084,961 A | * | 2/1992 | Yoshikawa | |
| 5,235,741 A | * | 8/1993 | Mase | |
| 5,328,087 A | * | 7/1994 | Nelson et al. | |
| 5,375,003 A | * | 12/1994 | Hirai | |
| 5,502,889 A | * | 4/1996 | Casson et al. | |
| 5,526,563 A | * | 6/1996 | Tamaki et al. | |
| 5,545,281 A | * | 8/1996 | Matsui et al. | 29/830 |
| 5,799,392 A | * | 9/1998 | Mishiro | |
| 5,819,406 A | * | 10/1998 | Yoshizawa et al. | 29/830 |
| 5,839,188 A | * | 11/1998 | Pommer | 29/830 |

* cited by examiner

*Primary Examiner*—Carl J. Arbes
(74) *Attorney, Agent, or Firm*—MacMillan, Sobanski & Todd, LLC (57) ABSTRACT

A method 10 for producing a circuit assembly 30 having a polymeric member 14 upon which conductors, such as conductors 64, may be easily and selectively interconnected to another circuit assembly device, and/or apparatus.

25 Claims, 6 Drawing Sheets

CIRCUIT ASSEMBLY AND A METHOD FOR MAKING THE SAME

FIELD OF THE INVENTION

This invention generally relates to a circuit assembly and to a method for making the same and, more particularly, to a polymeric type circuit assembly having at least one electrical conductor and which further includes a portion which allows the at least one conductor to be easily, reliably, and selectively interconnected to another circuit assembly and/or to a device or apparatus.

BACKGROUND OF THE INVENTION

Polymeric type circuit assemblies typically comprise a polymeric foil or member upon which a conductive tape or member having a polymer matrix and conductive particles is deployed. These circuit assemblies are widely used due to their relatively low cost of production.

While such circuit assemblies are relatively low in cost, they are not readily interconnected with and to other circuit assemblies, devices, and/or apparatuses. More particularly, such interconnections undesirably require crimping or the use of anisotropic conductive adhesive tape, or relatively expensive separable mechanical connectors, each of which are relatively costly and produce substantially unreliable connections.

There is therefore a need for a polymeric type electrical circuit assembly which may be selectively, reliably, and cost effectively interconnected to another circuit assembly, device, or apparatus, and there is a need for a method to produce such a circuit assembly. There is a further need for such a circuit assembly which may be used in a wide variety of applications.

SUMMARY OF THE INVENTION

It is a first object of the present invention to provide a polymeric circuit assembly which overcomes some or all of the previously delineated drawbacks of prior circuit assemblies and a method for producing such a circuit assembly.

It is a second object of the present invention to provide a polymeric circuit assembly which overcomes some or all of the previously delineated drawbacks of prior circuit assemblies and which, by way of example and without limitation, may be selectively, reliably, and cost effectively attached and/or interconnected to another circuit assembly, device, and/or apparatus.

It is a third object of the present invention to provide a polymeric circuit assembly which overcomes some or all of the previously delineated drawbacks of prior circuit assemblies and which includes at least one conductive portion which may be selectively, reliably, and cost effectively attached and/or interconnected to another circuit assembly, device, and/or apparatus.

According to a first aspect of the present invention, a circuit assembly is provided. The circuit assembly includes a polymeric foil member having at least one conductive portion which is attached to at least one conductive edge connector portion.

According to a second aspect of the present invention, a method for producing a polymeric circuit assembly is provided. The method includes the steps of placing at least one conductive portion upon a polymeric member; and solderably interconnecting the formed conductive portion to at least one edge connector.

These and other features, aspects, and advantages of the present invention will become apparent from a consideration of the following detailed description of the preferred embodiment of the invention and by reference to the following drawings.

DETAILED DESCRIPTION OF THE PREFERRED EMBODIMENT OF THE INVENTION

Referring now to FIGS. 1(a)–(e), there is shown a circuit assembly method 10 of the preferred embodiment of the invention. Particularly, method 10 includes a first step 12 in which a relatively thin strip 14 of polyethylene terapthalate or "PET" is provided. In other non-limiting embodiments of the invention, strip or foil member 14 may be comprised of some other polymeric material. Further, in step 12 an embossing tool 16 and a conventional copper-adhesive tape 17 are also provided.

Figure 1A:
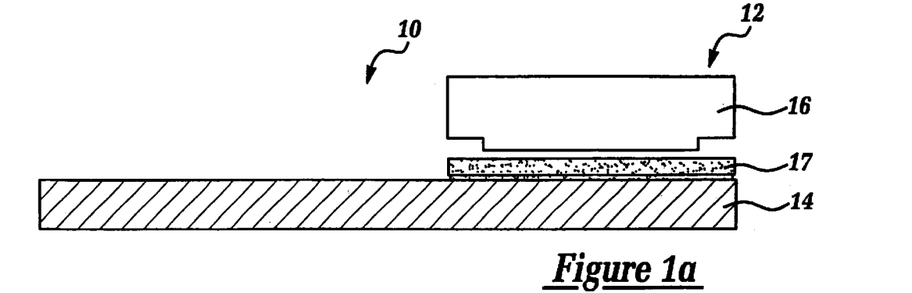
FIGS. 1(a)–(e) are successive side views illustrating the various steps of the circuit assembly formation methodology of the preferred embodiment of the invention.
Figure 1B:
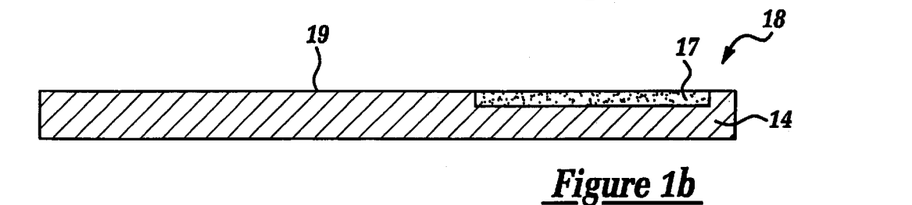

Step 18 follows step 12 and, in this step 18, the tool 16 is used to "hot emboss" the copper tape 17 onto strip 14. That is, in one non-limiting embodiment of the invention, the tool 16 is adapted to cut and embed substantially parallel strips of a conventional copper adhesive embossing tape 17 onto the surface 19 of the relatively thin polymeric strip 14. Further, in one non-limiting embodiment of the invention, the conductive tape is elevated, flush, or countersunk relative to the "undisturbed" portions of the surface 19. The depth to which the conductive tape 17 is placed into the member 14 is dependent upon the gauge or geometric configuration of the copper-adhesive embossing tape 17, the overall circuit design, and the thickness and type of the polyethylene terapthalate or other polymeric material which is used to construct the strip 14.

Figure 1C:
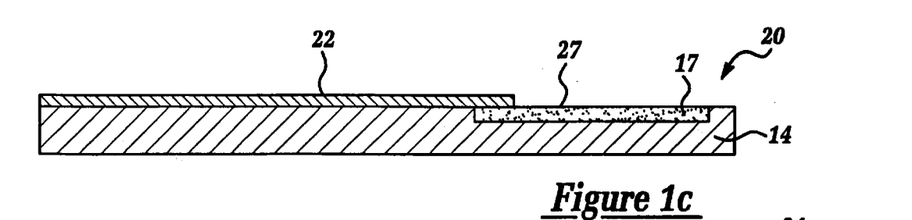
Figure 1D:
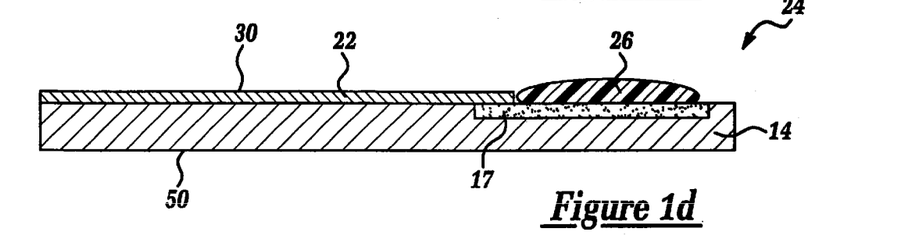

Step 20 follows step 18 and, in this step 20, a conductive ink trace 22 is printed over substantially the entire exposed portion of surface 19 and over a portion of the tape 17, thereby interconnecting with and/or "connecting to" the embossed tape 17. Step 24 follows step 20 and, in this step 24, solder paste 26 is applied to substantially all of the exposed surface 27 of the copper-adhesive tape 17, thereby forming a polymeric conductive ink type circuit, assembly 30 which may be easily interconnected with another circuit assembly, device, and/or apparatus.

Figure 1E:
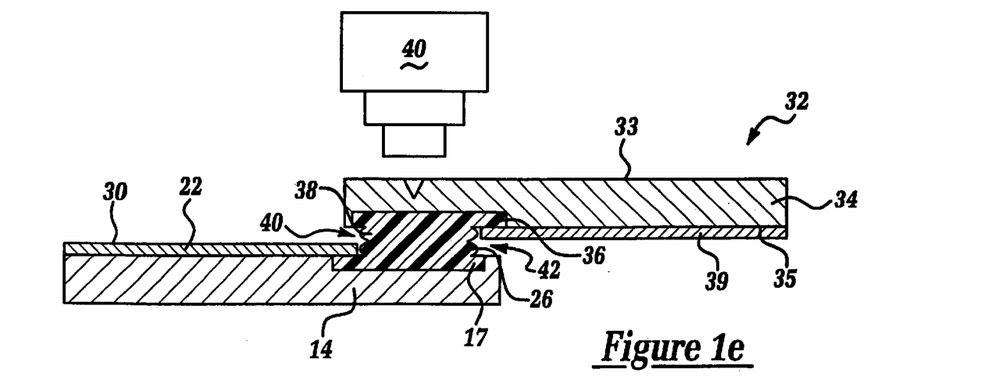

Process 10 may terminate upon the conclusion of step 24. Alternatively, process or methodology 10 may include the connection of the formed circuit assembly 30 to another assembly, device, and/or apparatus. By way of example and without limitation, step 32 may follow step 24 and, in this step 32, a circuit assembly 33 may be created which is substantially similar to circuit assembly 30. That is, circuit assembly 33 may be comprised of a PET type foil 34 which is substantially similar to foil or strip 14, which receives copper-adhesive tape 36 which is substantially similar to tape 17, conductive ink 39 which is substantially similar to conductive ink 22, and which further receives solder 38 which is substantially similar to solder 26. As shown, solder 38 may be connected to solder 26 by the use of a diode type laser device (or other type of metallurgical interconnecting device or methodology) 40, thereby allowing conductors present upon tape 17 to be physically, electrically, and communicatively coupled to conductors which are present upon the tape 36. Alternatively, the exposed surface of foil 34 (e.g., the portion of the surface 35 which does not receive the tape 36) may be physically coupled to the solder 26 and the metallurgical connection between the respective conductors of tape 17 and tape 36 may thereafter be made by the use of laser diode 40 upon the solder 26. In yet another alternate embodiment of the invention, neither circuit assembly 30 nor circuit assembly 33 initially receive solder. Rather, the circuit assemblies 30, 33 are aligned in the manner which is shown in FIG. 1(e) and solder is made to "flow through" openings 40, 42, thereby metallurgically coupling the conductor of tape 17 and tape 36 in the previously delineated manner. Further, it should be appreciated that circuit assembly 33 may be replaced by a conventional connector, a rigid circuit board, a wire harness, or substantially any other device, apparatus, connector, or physical entity.

Further, it should be appreciated that the conductive tape 17 may be selectively inserted into a standard edge card connector or solderably attached to a pin header or to one of a variety of diverse but known types of surface mounted connectors. Moreover, assembly 30 may be "double sided". That is, copper-adhesive tape may be selectively applied to surface 50 and processed in the previously delineated manner, thereby allowing the circuit assembly 30 to have a pair of opposed electrically conductive portions or surfaces.

Further, it should be realized that tape 17 may be replaced with metal which is adhered to the foil or strip 14 by the use of one of a wide variety of adhesives and may also be replaced by substantially any type of embossed metallic materials including multilaminar clad and plated constructions, and an embossed metal foil which has a relatively thick coating or layer of solder material, thereby eliminating step 24 of method 10.

In yet another non-limiting embodiment of the invention, a printed electrical conductor may be deposited upon the foil member 14 and then a monolithic metal layer or foil of material may be deposited upon the electrical conductor. The printed electrical conductor and the metal may then be embossed and, in another non-limiting embodiment, a portion of the embossed material is removed from the metal layer in order to permit selective electrical interconnection between the previously deposited metal and another conductor.

Figure 2:
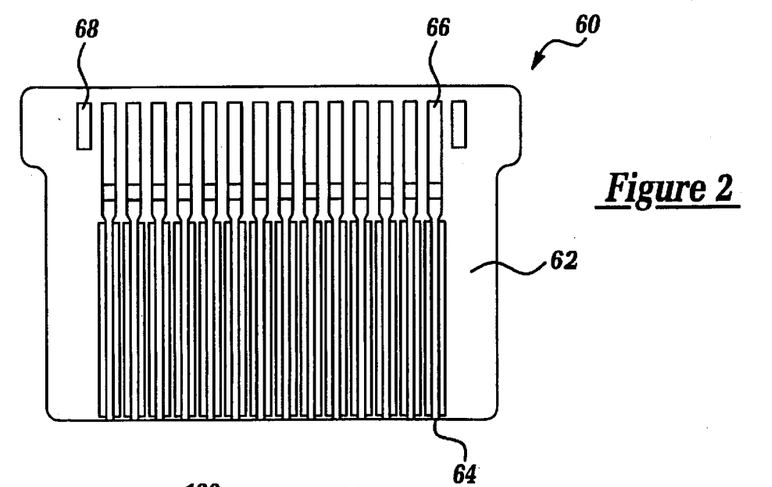
FIG. 2 is a top view of a circuit assembly which is made in accordance with the teachings of the preferred embodiment of the invention.

In yet a further non-limiting embodiment, embossed pads of material may be incorporated within and/or selectively formed upon the foil member 14 in order to provide relief from stress or deformation. These features are shown, by way of example and without limitation, by circuit assembly 60 of FIG. 2. As shown, polymeric foil 62, which is substantially similar to foil member 14, has a plurality of conductive traces, such as trace 64, which are formed from within and/or upon the member 62 and a plurality of connecting edge portions, such as edge portion 66, which are formed within and/or upon conductive tape, such as tape 17. Assembly 60 further has a strain relief pad 68 which may be of a desired shape and size and which provides relief from stresses or strains applied to the assembly 60.

Figure 3A:
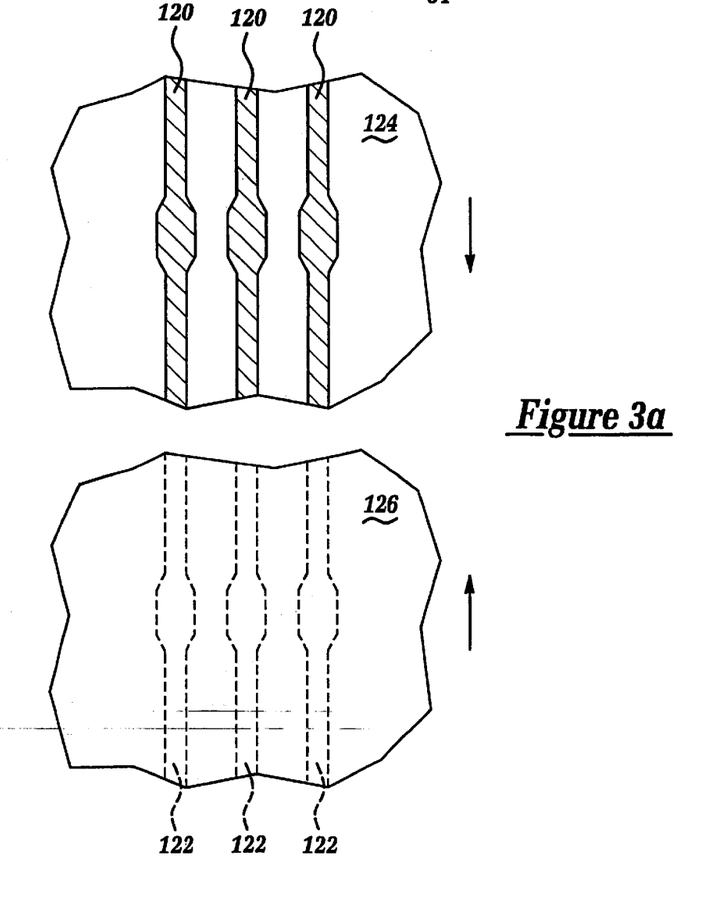
FIGS. 3(a)–(e) illustrate a method for interconnecting circuit traces which is performed in accordance with the teachings of another embodiment of the present invention.
Figure 3B:
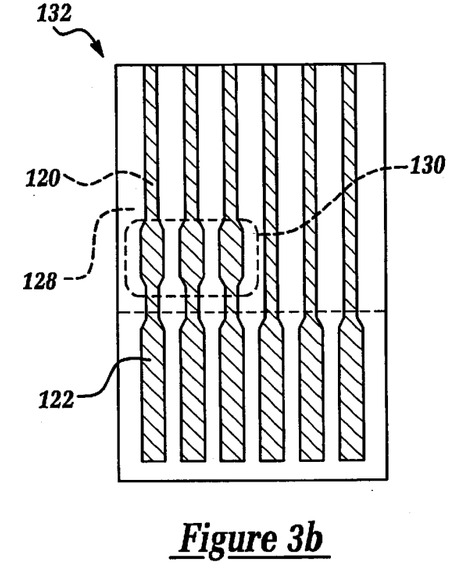
Figure 3C:
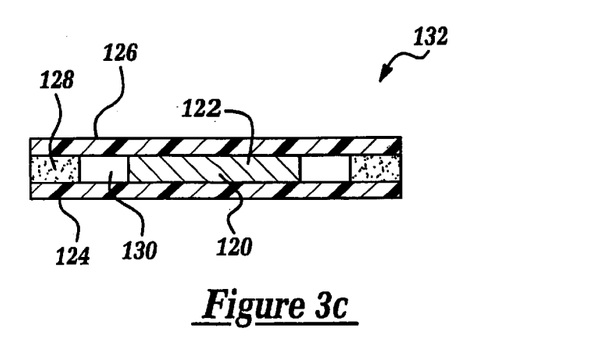

Referring now to FIGS. 3(a)–(e), there is shown a method of interconnecting conductive traces of a multi-layered printed ink device which may include circuit 10 and/or comprise a portion of a sensor assembly. As shown in FIG. 3(a) the method begins when the "up-facing" traces 120 of the device, which are printed or otherwise disposed on the bottom circuit substrate layer 124, are aligned with the "down-facing" traces 122 of the device, which are printed or otherwise disposed on the top circuit substrate layer 126. Layers 124 and 126 are preferably made from a polymeric material such as PET. The traces 120, 122 are then brought together and are made to overlap, as shown best in FIGS. 3(b) and (c). The substrate layers 124, 126 are then joined by the use of adhesive material 128 which may be selectively applied to the layers 124, 126, thereby forming assembly 132. In the preferred embodiment, before the layers 124, 126 are joined, an aperture 130 is selectively formed within the adhesive material 128 in the region where the conductive traces 120, 122 overlap.

Figure 3D:
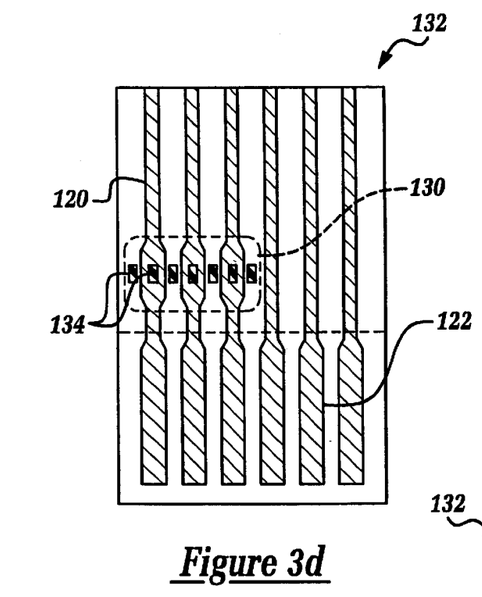
Figure 3E:
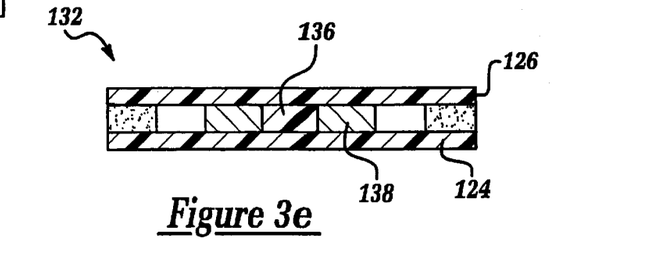

Referring now to FIGS. 3(d) and (e), once the substrate layers 124, 126 are joined, a relatively high amount of pressure and heat is applied to highly localized areas 134 of assembly 132. The pressure and heat is applied to areas 134 in a conventional manner, such as by use of a conventional ultrasonic bonding tool or by other heat and/or pressure application methods. The compression force and heat imparted upon assembly 132 causes melting and deformation of the circuit substrate layers 124, 126, effective to form a "pillar" or column 136 of substrate material which joins top layer 126 to bottom layer 124, and which causes conductive layers 120, 122 to form a "ring" 138 of displaced conductive material, as shown best in FIG. 3(e).

The foregoing method has the advantage of providing strain relief and to reduce relative motion between the top and bottom substrate layers 126, 124 in the exact area where such relief is required. Additional melted areas 134 may be formed between conductive traces further to improve strain relief. It should be appreciated that the "remelted" areas or "pillars" 136 may be of any suitable shape, such as conical, triangular, elongated or oval shapes. The remelted areas 136 may be formed in an aligned array, as shown in FIG. 3(d), or may be formed in an unaligned array. By allowing for both up-facing and down-facing traces to be affixed to one surface, the tolerances between adjacent traces at the external attachment interface area may be controlled more precisely than prior designs. The foregoing method further eliminates dimensional offset and split between layers in the interconnecting area, common with prior methods.

Figure 4:
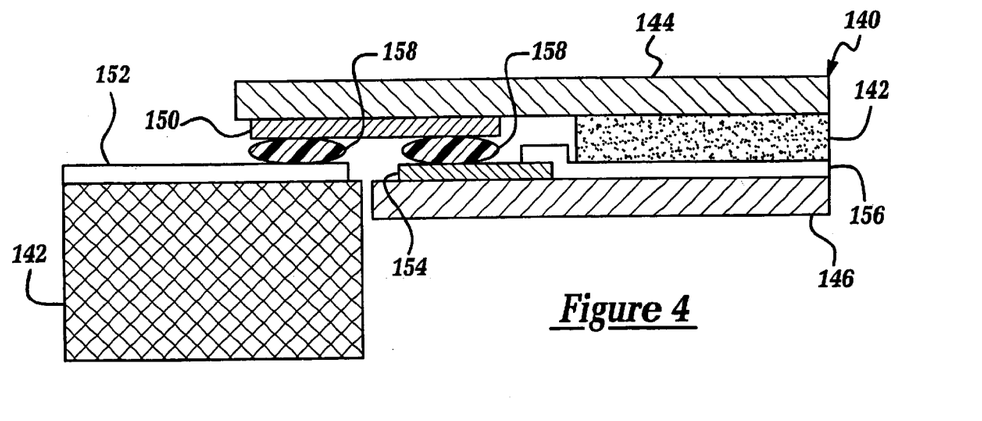
FIG. 4 a is a sectional view of a connection between a circuit assembly and a printed wiring board which is formed according to the teachings of another embodiment of the present invention.

Referring now to FIG. 4, there is shown an interconnection between an "interposer" or interface circuit assembly 140 and a printed wiring board 142, which is formed in accordance with another embodiment of the present invention. Circuit assembly 140 may be operatively connected to or form a portion of a sensor assembly. The circuit assembly 140 includes a top substrate layer 144 and a bottom substrate layer 146 which, in the preferred embodiment, are each formed from a polymer material such as commercially available "PET" material. Layers 144 and 146 are coupled together by an adhesive layer 148 which is disposed between layers 144, 146. Circuit assembly 140 further includes a "layer jumper" conductive pad 150 which is embossed on the bottom surface of layer 144, and which in one non-limiting embodiment is manufactured from a copper material. Pad 150 is partially disposed over the conductive trace 152 of printed wiring board 142. Pad 150 further extends over a second conductive pad 154 which is embossed on the top surface of the bottom substrate layer 146 and which is connected to a conductive trace 156.

In order to form the interconnection, circuit assembly 140 is positioned as shown in FIG. 4, and solder paste 158 is applied to jumper pad 150 in the region directly above pad 154 and trace 152. Thermal energy is then applied to the circuit assembly 140 at jumper pad 150, effective to melt or liquefy the solder 158 into the interfaces between pad 150, conductive trace 152, and pad 154, thereby metallurgically and electrically bonding pad 150 to trace 152 and pad 154. The interface between circuit assembly 140 and printed wiring board 142 is through a single layer 144, and the bottom layer 146 does not contact printed wiring board 142.

The novel interconnection allows for both "up-facing" traces and "down-facing" traces to be affixed on one surface, thereby allowing the tolerance between adjacent traces to be controlled more precisely than in prior connection methods. Moreover, the present connection eliminates the need for crimping and thereby provides for a more robust connection between flat circuit assembly 140 and printed wiring board 142.

Figures 5A, 5B:
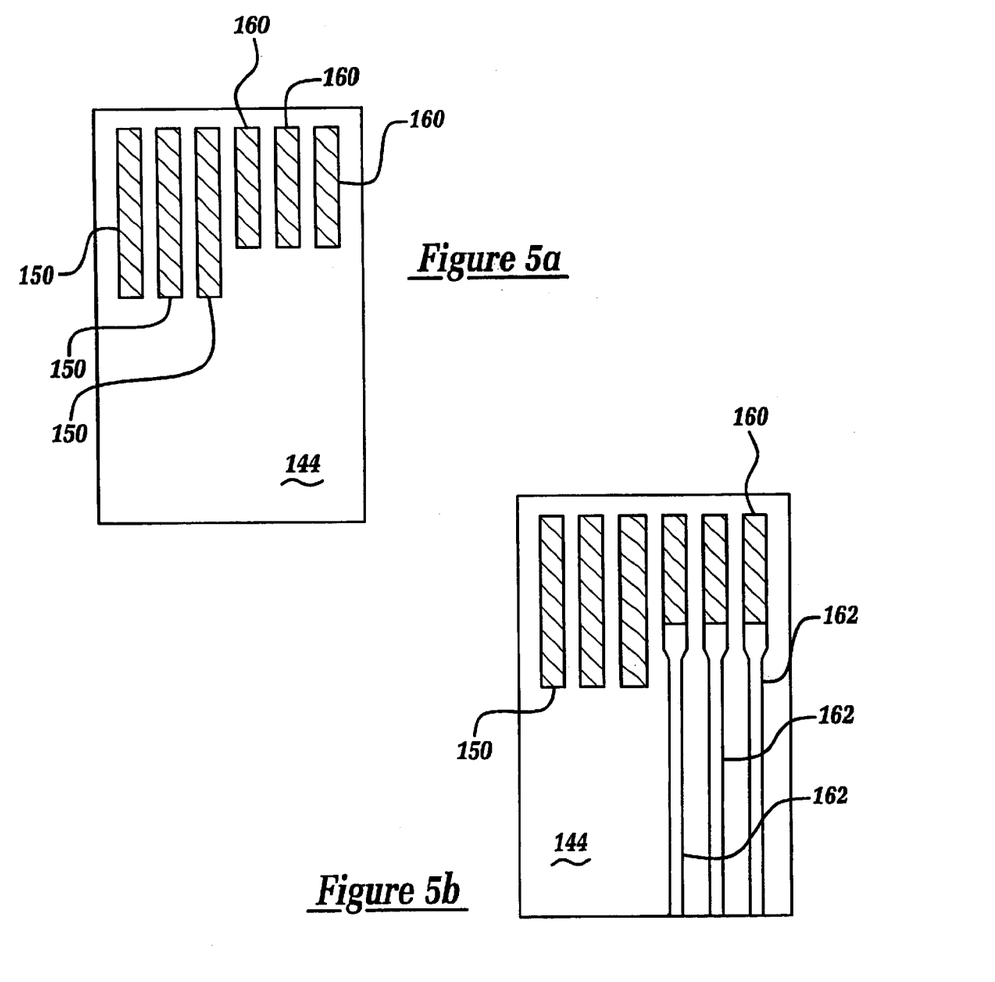
FIGS. 5(a)–(e), illustrate a method for forming the circuit assembly shown in FIG. 6.
Figures 5C, 5D:
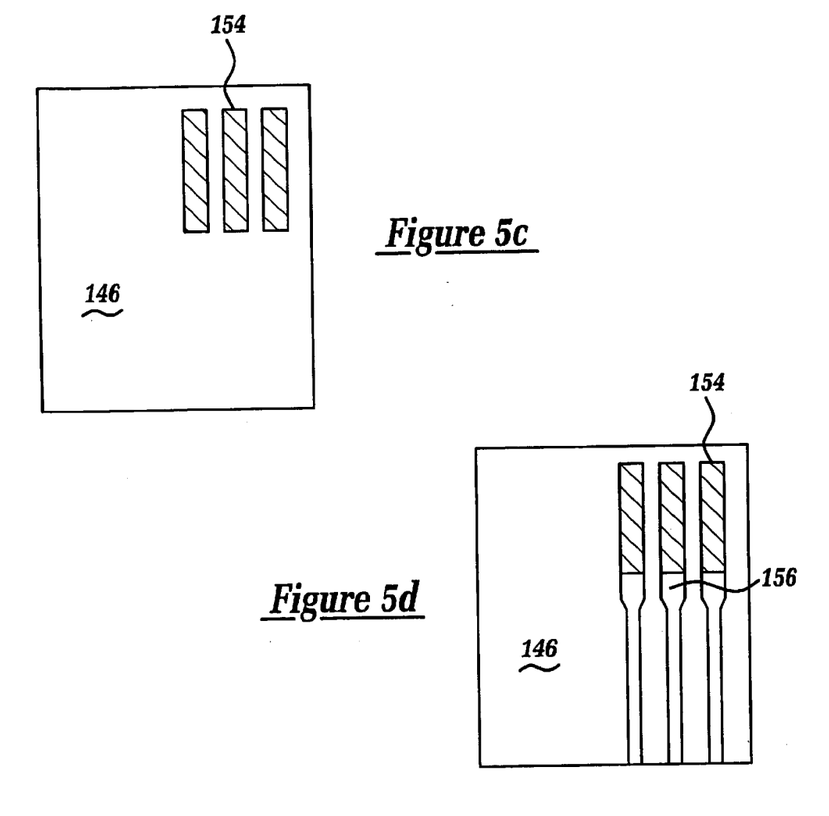
Figure 5E:
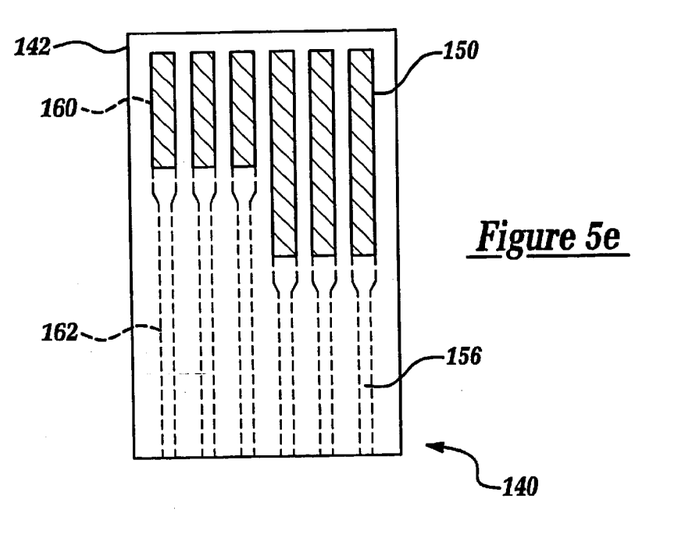

Referring now to FIGS. 5(a)–(e), there is shown a method for forming circuit assembly 140 and connecting assembly 140 with printed wiring board 142. The method begins by selectively applying and/or attaching copper jumper pads 150 to the top substrate layer 144 in a conventional manner, and by selectively applying and/or attaching ink interface pads 160 to the top substrate layer 144 in a conventional manner. In the next step, shown in FIG. 5(b), conductive ink is selectively applied to pads 160 and to layer 144 in a conventional manner, thereby forming traces 162. Ink interface pads 154 are then selectively applied or attached to the bottom substrate layer 146 in a conventional manner, as shown in FIG. 5(c). In the next step, shown in FIG. 5(d), conductive ink is applied to pads 154 and to layer 146 in a conventional manner, thereby forming traces 156. In one non-limiting embodiment, the conductive material or ink used to form traces 162, 156 comprises silver. Adhesive material 148 is then applied to layers 144 and 146, and the layers 144, 146 are aligned such that jumper pads 150 partially overlap and/or are partially disposed over pads 154, as shown in FIG. 4. Layers 144, 146 are then joined to form the circuit assembly 140, which is then selectively attached to printed wiring board 142 in the previously described manner.

Figure 6:
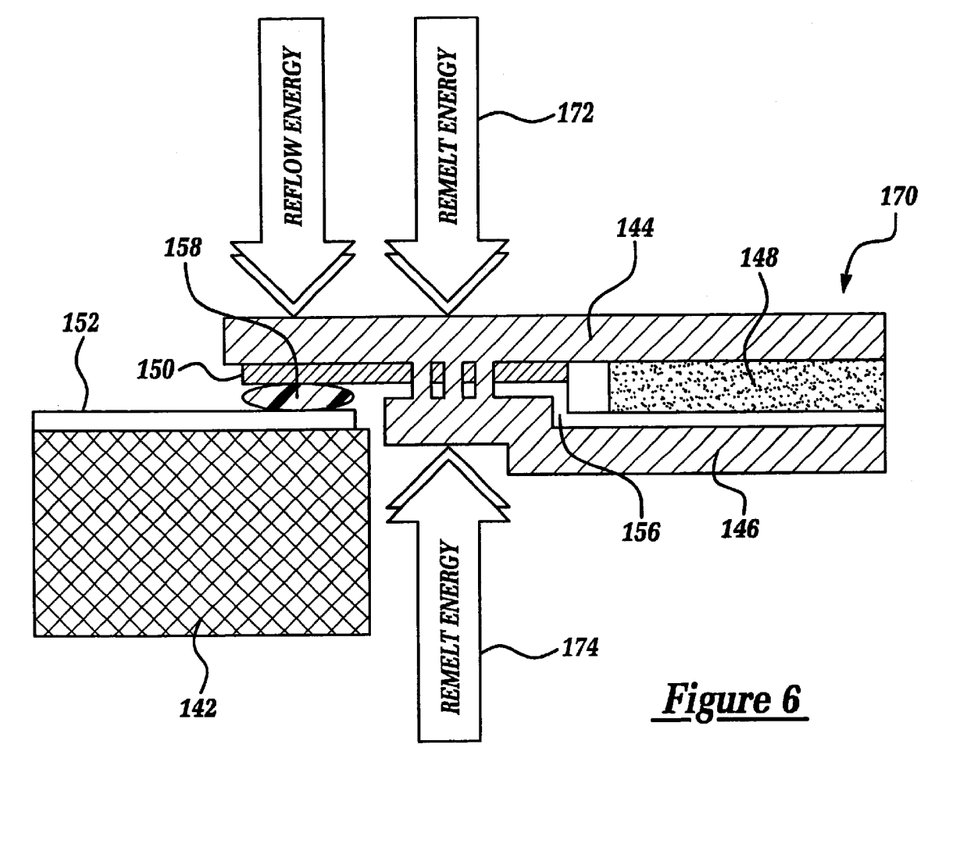
FIG. 6 illustrates a sectional view of a connection between a circuit assembly and a printed wiring board which is formed according to the teachings of another embodiment of the present invention.

Referring now to FIG. 6, there is shown an interconnection between an "interposer" or interface circuit assembly 170 and a printed wiring board 142, which is formed in accordance with another embodiment of the present invention. Circuit assembly 170 is substantially identical to circuit assembly 140 with the exception that pad 154 has been eliminated. In this embodiment, jumper pad 150 is preferably made from a material which enables a reliable rigid connection to be formed between circuit assembly 170 and printed wiring board 142. In one non-limiting embodiment, pad 150 is made from a bonded copper foil.

In order to form the interconnection, circuit assembly 170 is positioned as shown in FIG. 6, and solder paste 158 is applied to jumper pad 150 in the region directly above trace 152. Thermal energy is then selectively applied to the circuit assembly 140 at jumper pad 150, effective to melt or reflow the solder 158 into the interface between pad 150 and conductive trace 152, thereby metallurgically and electrically bonding pad 150 to trace 152. In one embodiment, the subassembly including the jumper pad 150 and the top layer 144 is attached to printed wiring board 142 prior to attaching the bottom layer 146 to the top layer 144. Once the jumper pad 150 has been attached to trace 152, the conductive trace 156 is joined to the jumper pad 150 by the use of "out-of-circuit plane energy". Particularly, heat and pressure is applied to the interface between bottom layer 146 and top layer 144 in the directions of arrows 172, 174, thereby bonding trace 156 to jumper pad 150. The heat and pressure applied to bond trace 156 to pad 150 is applied by a conventional method, such as ultrasonic welding or staking. In one non-limiting embodiment, "out of plane" energy is used to form both the interconnection between jumper pad 150 and trace 152, and the interconnection between the trace 156 and jumper pad 150.

The foregoing interconnection method allows for a flat flexible device, such as a mat sensor assembly to be securely and robustly connected to a printed wiring board. Moreover, the method allows all traces (e.g., sensor traces) to be brought to the same side of the circuit or sensor assembly, thereby simplifying subsequent attachment. The foregoing method also efficiently utilizes the jumper pad 150 to provide a thermal barrier separating the relatively high temperature component attachment-induced thermal stability requirements of the rigid logic printed wiring board 142 from the relatively thermally fragile circuit or sensor assembly.

It is to be understood that the invention is not limited to the exact construction and method which has been previously delineated, but that various changes and modifications may be made without departing from the spirit and the scope of the inventions as are set forth in the following claims.

What is claimed is:

1. A method of making a solderable flexible printed circuit, said method comprising the steps of:

providing a thin-strip polymeric substrate;

embossing a metallic conductive pad into said polymeric substrate so that said metallic conductive pad is retained on said polymeric substrate and has an exposed surface; and printing conductive ink to form traces over said polymeric substrate and said exposed surface of said conductive metal pad;

wherein said exposed surface of said conductive metal pad is adapted to receive solder paste to facilitate soldering said flexible printed circuit to other circuit assemblies.

2. The method of claim 1 first her comprising the step of applying said solder paste to said exposed surface of said conductive metal pad.

3. The method of claim 1 wherein said metallic conductive pad is cut from an embossing tape and embedded into said polymeric substrate while being heated.

4. A method for connecting a first trace formed of conductive ink on a top surface of a first polymeric substrate layer with a second trace formed of conductive ink on a bottom surface of a second polymeric substrate layer, said method comprising the steps of:

embossing a first conductive tape into said first polymeric substrate layer;

printing said first trace of conductive ink over both said first polymeric substrate layer and said first conductive tape;

embossing a second conductive tape into said second polymeric substrate layer;

printing said second trace of conductive ink over both said second polymeric substrate layer and said second conductive tape;

aligning said first conductive tape with said second conductive tape;

positioning said first substrate layer over said second substrate layer such that said first and second conductive tapes overlap;

joining said first substrate layer and said second substrate layer by use of an adhesive material; and selectively applying a relatively high amount of pressure and heat to a localized area over said overlapping first-and second substrate layers, effective to form a pillar of substrate material through said overlapping first and second substrate layers which joins said first substrate layer to said second substrate layer, thereby providing strain relief and reduced relative motion between said first and second substrate layers.

5. The method of claim 4 wherein said polymeric substrate layers comprise PET.

6. The method of claim 4 further comprising the step of selectively forming an aperture within said adhesive material around said overlapping first and second substrate layers.

7. The method of claim 4 wherein said pillar is generally conical in shape.

8. The method of claim 4 wherein said pillar is generally oval in shape.

9. The method of claim 4 wherein said relatively high amount of pressure and heat is applied by use of an ultrasonic bonding tool.

10. A method for connecting a multi-layer circuit assembly including a top polymeric substrate layer and a bottom polymeric substrate layer to a substantially rigid printed wiring board, said method comprising the steps of:

attaching a first conductive metallic pad to said bottom polymeric substrate layer;

forming at first conductive trace on said bottom conductive layer, said first conductive trace comprised of a conductive ink and partially printed over said first conductive metallic pad;

attaching a second conductive metallic pad to said top polymeric substrate layer;

attaching said top and bottom polymeric substrate layers such that a first portion of said second conductive metallic pad is disposed over said first conductive metallic pad, thereby forming said multi-layer circuit assembly;

positioning said multi-layer circuit assembly over a second conductive trace on said printed wiring board such that a second portion of said second conductive metallic pad is disposed over said second conductive trace;

selectively applying solder material between said second conductive metallic pad and said second conductive trace and between said second conductive metallic pad and said first conductive metallic pad; and applying thermal energy to said multi-layer circuit assembly effective to cause said solder material to metallurgically bond with said first and second conductive metallic pads and said second conductive trace, thereby forming a robust connection between said first conductive trace and said second conductive trace.

11. The method of claim 10 wherein said polymeric substrate layers comprise PET.

12. The method of claim 11 wherein said first and second conductive metallic pads are made from a copper material.

13. The method of claim 10 wherein said top and bottom substrate layers are attached by use of an adhesive material.

14. The method of claim 10 wherein said multi-layer circuit assembly is connected to a sensor assembly.

15. A method of interconnecting electrical devices mounted on separate circuit assemblies, at least one of said circuit assemblies comprising a flexible printed circuit, said method comprising the steps of:

providing a thin-strip polymeric substrate;

embossing a metallic conductive pad into said polymeric substrate so that said metallic conductive pad is retained on said polymeric substrate and has an exposed surface;

printing conductive ink to form traces over said polymeric substrate and said exposed surface of said conductive metal pad;

mounting a respective one of said electrical devices to at least one of said traces;

bringing said metallic conductive pad into proximity with an interconnection portion of said other circuit assembly; and soldering said exposed surface of said conductive metal pad to said interconnection portion of said other circuit assembly.

16. The method of claim 15 wherein said respective one of said electrical devices is comprised of a sensor.

17. The method of claim 15 further comprising the step of applying solder paste to said exposed surface of said conductive metal pad prior to bringing said metallic conductive pad into proximity with said interconnection portion of said other circuit assembly.

18. The method of claim 15 further comprising the step of flowing molten solder between said exposed surface of said conductive metal pad and said interconnection portion of said other circuit assembly after bringing said metallic conductive pad into proximity with said interconnection portion of said other circuit assembly.

19. The method of claim 15 wherein said interconnection portion of said other circuit assembly is comprised of an exposed surface of a conductive metal pad of another flexible printed circuit having a thin-strip polymeric substrate.

20. The method of claim 15 wherein said interconnection portion of said other circuit assembly is comprised of a solder pad of a rigid printed circuit board.

21. The method of claim 15 wherein said interconnection portion of said other circuit assembly is comprised of a pin connector.

22. The method of claim 15 wherein said interconnection portion of said other circuit assembly is comprised of a surface mount connector.

23. The method of claim 15 wherein said interconnection portion of said other circuit assembly is comprised of a wire harness.

24. The method of claim 19 further comprising the step of heating a localized overlapping area of said flexible printed circuits to form a strain relief feature between said flexible printed circuits.

25. The method of claim 15 further comprising the step of coating said metallic conductive pad with solder prior to said embossing step.

* * * * *